(12) United States Patent
Koyanagi et al.

(10) Patent No.: US 8,311,148 B2
(45) Date of Patent: Nov. 13, 2012

(54) TRANSMISSION SIGNAL GENERATING APPARATUS, METHOD, AND PROGRAM

(75) Inventors: Kenji Koyanagi, Tokyo (JP); Motoya Iwasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 372 days.

(21) Appl. No.: 12/663,741

(22) PCT Filed: May 13, 2008

(86) PCT No.: PCT/JP2008/058756
§ 371 (c)(1),
(2), (4) Date: Dec. 9, 2009

(87) PCT Pub. No.: WO2009/004862
PCT Pub. Date: Jan. 8, 2009

(65) Prior Publication Data
US 2010/0172438 A1   Jul. 8, 2010

(30) Foreign Application Priority Data
Jun. 29, 2007   (JP) .................................. 2007-172127

(51) Int. Cl.
*H04K 1/02* (2006.01)
(52) U.S. Cl. ........ 375/296; 375/260; 375/295; 375/297; 375/300; 375/302
(58) Field of Classification Search .................. 375/260, 375/271, 295, 296, 298–300, 316
See application file for complete search history.

(56) References Cited

U.S. PATENT DOCUMENTS

| | | | |
|---|---|---|---|
| 7,627,046 B1 * | 12/2009 | Dick et al. | 375/260 |
| 7,649,950 B2 * | 1/2010 | Shen et al. | 375/260 |
| 7,969,205 B2 * | 6/2011 | Nagatani et al. | 327/105 |
| 8,098,744 B2 * | 1/2012 | Chen et al. | 375/260 |
| 8,102,925 B2 * | 1/2012 | Shoemake | 375/260 |
| 8,175,179 B2 * | 5/2012 | Baliga et al. | 375/260 |
| 2004/0233836 A1 * | 11/2004 | Sumasu et al. | 370/206 |
| 2005/0100108 A1 * | 5/2005 | Yun et al. | 375/260 |
| 2007/0047431 A1 * | 3/2007 | Nishio et al. | 370/203 |

(Continued)

FOREIGN PATENT DOCUMENTS

JP   2001024617 A   1/2001

(Continued)

OTHER PUBLICATIONS

International Search Report for PCT/JP2008/058756 mailed Aug. 19, 2008.

(Continued)

*Primary Examiner* — Hirdepal Singh (57) ABSTRACT

Data multiplexing subcarrier identification signal generating means generates a data multiplexing subcarrier identification signal that identifies subcarriers with which data signals are to be multiplexed. Transmission signal generating means generates transmission signals by multiplexing data signals with subcarriers according to the data multiplexing subcarrier identification signal. Peak reducing transmission signal generating means generates peak reducing transmission signals by reducing peak power of the transmission signals according to peak reducing signals in a combination of a first peak reducing process in which subcarriers with which the data signals are not multiplexed are used for the peak reducing signals and subcarriers with which the data signals are multiplexed are not used for the peak reducing signals, and a second peak reducing process in which both subcarriers with which the data signals are not multiplexed and the subcarriers with which the data signals are multiplexed are used for the peak reducing signals.

7 Claims, 10 Drawing Sheets

U.S. PATENT DOCUMENTS

| | | | |
|---|---|---|---|
| 2009/0080454 A1* | 3/2009 | Koyanagi | 370/445 |
| 2010/0150256 A1* | 6/2010 | Morris et al. | 375/260 |
| 2010/0177847 A1* | 7/2010 | Woodward | 375/296 |
| 2012/0032855 A1* | 2/2012 | Reede et al. | 342/458 |

FOREIGN PATENT DOCUMENTS

| | | |
|---|---|---|
| JP | 2002314503 A | 10/2002 |
| JP | 2005101975 A | 4/2005 |
| JP | 2005516467 A | 6/2005 |
| JP | 2005294996 A | 10/2005 |
| JP | 2007074148 A | 3/2007 |
| WO | 2005025102 A | 3/2005 |

OTHER PUBLICATIONS

J. Tellado, "Multicarrier Modulation with Low Par Applications to DSL and Wireless", Kluwer Academic Publishers, 2000, pp. 64-95.

Nortel, "OFDMA UL PAPR Reduction", 3GPP TSG-RANI #42, R1-05089 1, Sep. 2, 2005.

Zte et al., "PAPR reduction for OFDMA using improved tone reservation with low complexity", 3GPP TSG-RAN1 WG1 #42, R1-050836, Sep. 3, 2005.

* cited by examiner

| | PAPR REDUCTION(CCDF=10⁻³) | MODULATION ACCURACY |
|---|---|---|
| TR with RT | 1.2dB | 0% |
| TR without | 1.4dB | 3.1% |
| 1ST EXEMPLARY EMBODIMENT | 1.5dB | 1.0% |

| | 4TH EXEMPLARY EMBODIMENT | | | TR with RT | | | TR without RT |
|---|---|---|---|---|---|---|---|
| PEAK REDUCING SIGNAL MULTIPLEX INFORMATION ($S_{AL}$) | 0.05 | 0.10 | 0.20 | 0.05 | 0.10 | 0.20 | 0.00 |
| PAPR REDUCTION ($a = R - T_{w/oRT}$) [dB] | 2.5 | 2.9 | 3.5 | 1.2 | 1.6 | 2.1 | 1.4 |
| PAPR REDUCING SIGNAL POWER (b) [dB] | 0.2 | 0.3 | 0.3 | 0.2 | 0.3 | 0.3 | N/A |
| PAPR REDUCTION GAIN ($V = a - b - c$) [dB] | 2.3 | 2.6 | 3.2 | 1.0 | 1.3 | 1.8 | 1.4 |

TRANSMISSION SIGNAL GENERATING APPARATUS, METHOD, AND PROGRAM

The present application is the National Phase of PCT/JP2008/058756, filed May 13, 2008, which claims priority based on Japanese patent application No. 2007-172127 filed on Jun. 29, 2007, and incorporates herein the disclosure thereof in its entirety by reference.

TECHNICAL FIELD

The present invention relates to a transmission signal generating apparatus for generating transmission signals in a wireless transmission system.

BACKGROUND ART

In recent years, attention has been drawn to OFDM (Orthogonal Frequency Division Multiplexing). The OFDM has such features that the receiver has a relatively simple circuit arrangement, the propagation path can be regarded as flat in terms of subcarriers, and it can easily be expanded into MIMO (Multiple Input Multiple Output).

According to the OFDM, since a plurality of carriers are multiplexed in time domain, the signal power exhibits a high peak when the carriers are brought into phase with each other in time domain. The high peak leads to an increase in PAPR (Peak to Average Power Ratio). As the increased PAPR reduces the coverage of the base station and increases the power consumption, there has been a need for reducing the PAPR.

Some PAPR reducing processes based on TR (Tone Reservation) have been proposed so far. For example, a TR with RT (Reserved Tones) process has been proposed in Multicarvier modulation with low PAR application to DSL and wireless, Jose Tellado, Kluwer academic Publications and OFDMA UL PAPR Reduction, R1-050891, Nortel, 3GPP TSG-RAN WG1 #42, London, UK, 29 Aug.-3 Sep. 2005. A TR without RT process has been proposed in PAPR reduction for OFDMA using improved tone reservation with low complexity, R1-050836, ZTE, CATT, 3GPP TSG-RAN WG1 #42, London, UK, 29 Aug.-3 Sep. 2005.

According to the TR with RT process, a subcarrier for a peak reducing signal is provided in addition to a subcarrier for a data signal, and a peak reducing signal for reducing peak power is generated in the subcarrier for a peak reducing signal. The peak reducing signal is added to the data signal, thereby reducing the peak power.

According to the TR without RT process, a peak reducing signal is generated in the same band as a data signal and with sufficiently low power compared with the data signal, and is added to the data signal, thereby reducing the peak power.

The TR with RT process has such features that it can reduce the PAPR without lowering the modulation accuracy (highering EVM) though the spectrum use efficiency is lowered as the reduction in the PAPR increases. The TR without RT process has such features that the spectrum use efficiency is not lowered though the modulation accuracy is lowered as the reduction in the PAPR increases.

DISCLOSURE OF THE INVENTION

The TR with RT process is capable of reducing the PAPR without causing the EVM to increase (modulation accuracy to decrease). In the TR with RT process, however, the maximum reduction in the PAPR is limited by the number of subcarriers.

In the TR without RT process, the maximum reduction in the PAPR is not limited by the number of subcarriers. However, the EVM becomes higher as the reduction in the PAPR is increased in the TR without RT process.

Insofar as a target PAPR can be achieved by the TR with RT process, the PAPR can be lowered by the TR with RT process without highering the EVM at all. Insofar as a target PAPR cannot be achieved by the TR with RT process, it is necessary to use the TR without RT process for achieving the target PAPR. However, the TR without RT process tends to higher the EVM as the PAPR is lowered. If the EVM that is required is lower than a value at the time the target PAPR is achieved by the TR without RT process, then the TR without RT process cannot be used.

As described above, the TR with RT process and the TR without RT process have both advantages and disadvantages. Neither of them is able to perform a peak reduction sequence for satisfying both a target signal power peak reduction and a required modulation accuracy.

It is an object of the present invention to provide a transmission signal generating apparatus which is capable of achieving both a modulation accuracy and a signal power peak reduction in a balanced manner.

To accomplish the above object, according to an aspect of the present invention, a transmission signal generating apparatus for generating transmission signals with reduced peak power, comprises:

data multiplexing subcarrier identification signal generating means for generating a data multiplexing subcarrier identification signal that identifies subcarriers with which data signals are to be multiplexed;

transmission signal generating means for generating transmission signals by multiplexing data signals with subcarriers according to the data multiplexing subcarrier identification signal generated by said data multiplexing subcarrier identification signal generating means; and peak reducing transmission signal generating means for generating peak reducing transmission signals by reducing peak power of said transmission signals generated by said transmission signal generating means according to peak reducing signals in a combination of a first peak reducing process in which subcarriers with which the data signals are not multiplexed are used for the peak reducing signals and subcarriers with which the data signals are multiplexed are not used for the peak reducing signals based on said data multiplexing subcarrier identification signal, and a second peak reducing process in which both subcarriers with which the data signals are not multiplexed and the subcarriers with which the data signals are multiplexed are used for the peak reducing signals.

According to an aspect of the present invention, a transmission signal generating method of generating transmission signals with reduced peak power comprises:

generating a data multiplexing subcarrier identification signal that identifies subcarriers with which data signals are to be multiplexed;

generating transmission signals by multiplexing data signals with subcarriers according to the data multiplexing subcarrier identification signal; and generating peak reducing transmission signals by reducing peak power of said transmission signals according to peak reducing signals in a combination of a first peak reducing process in which subcarriers with which the data signals are not multiplexed are used for the peak reducing signals and subcarriers with which the data signals are multiplexed are not used for the peak reducing signals based on said data multiplexing subcarrier identification signal, and a second peak reducing process in which both subcarriers with which the data signals are not multiplexed and the subcarriers with which the data signals are multiplexed are used for the peak reducing signals.

According to an aspect of the present invention, a transmission signal generating program for controlling a transmission signal generating apparatus to generate transmission signals with reduced peak power, comprises:

a sequence to generate a data multiplexing subcarrier identification signal that identifies subcarriers with which data signals are to be multiplexed;

a sequence to generate transmission signals by multiplexing data signals with subcarriers according to the data multiplexing subcarrier identification signal; and a sequence to generate peak reducing transmission signals by reducing peak power of said transmission signals according to peak reducing signals in a combination of a first peak reducing process in which subcarriers with which the data signals are not multiplexed are used for the peak reducing signals and subcarriers with which the data signals are multiplexed are not used for the peak reducing signals based on said data multiplexing subcarrier identification signal, and a second peak reducing process in which both subcarriers with which the data signals are not multiplexed and the subcarriers with which the data signals are multiplexed are used for the peak reducing signals.

BEST MODE FOR CARRYING OUT THE INVENTION

Exemplary embodiments of the present invention will be described in detail with reference to the drawings.

First Exemplary Embodiment

Figure 1:
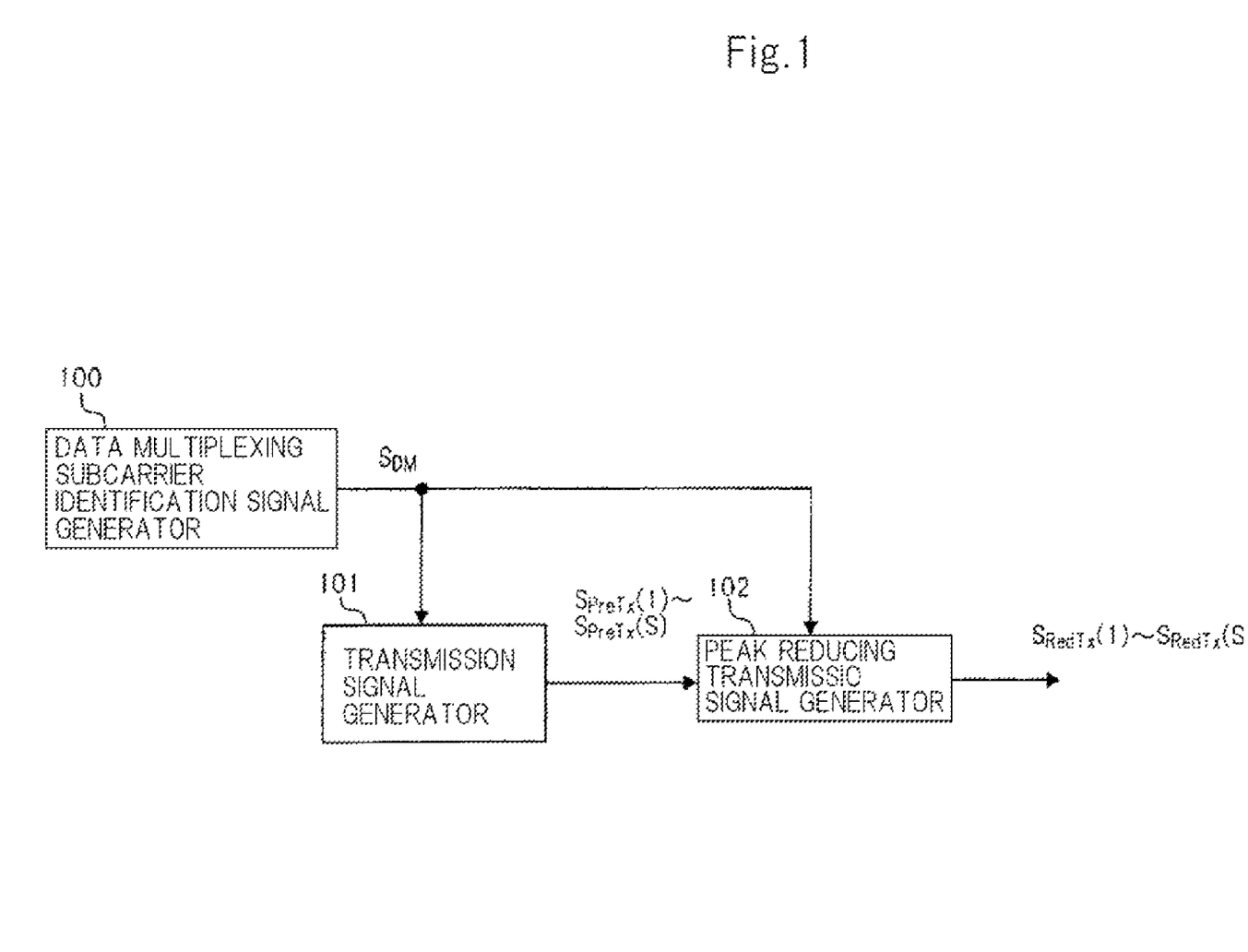
FIG. 1 is a block diagram showing a configuration of a transmission signal generating apparatus according to a first exemplary embodiment.

FIG. 1 is a block diagram showing a configuration of a transmission signal generating apparatus according to a first exemplary embodiment. As shown in FIG. 1, the transmission signal generating apparatus comprises data multiplexing subcarrier identification signal generator 100, transmission signal generator 101, and peak reducing transmission signal generator 102.

Data multiplexing subcarrier identification signal generator 100 generates and outputs data multiplexing subcarrier identification signal $S_{DM}$ which is indicative of subcarriers for multiplexing data symbols among all subcarriers. Therefore, it is possible to identify those subcarriers which multiplex data symbols and those subcarriers which do not multiplex data symbols among all subcarriers. Data multiplexing subcarrier identification signal $S_{DM}$ is input to transmission signal generator 101 and peak reducing transmission signal generator 102.

Figure 2:
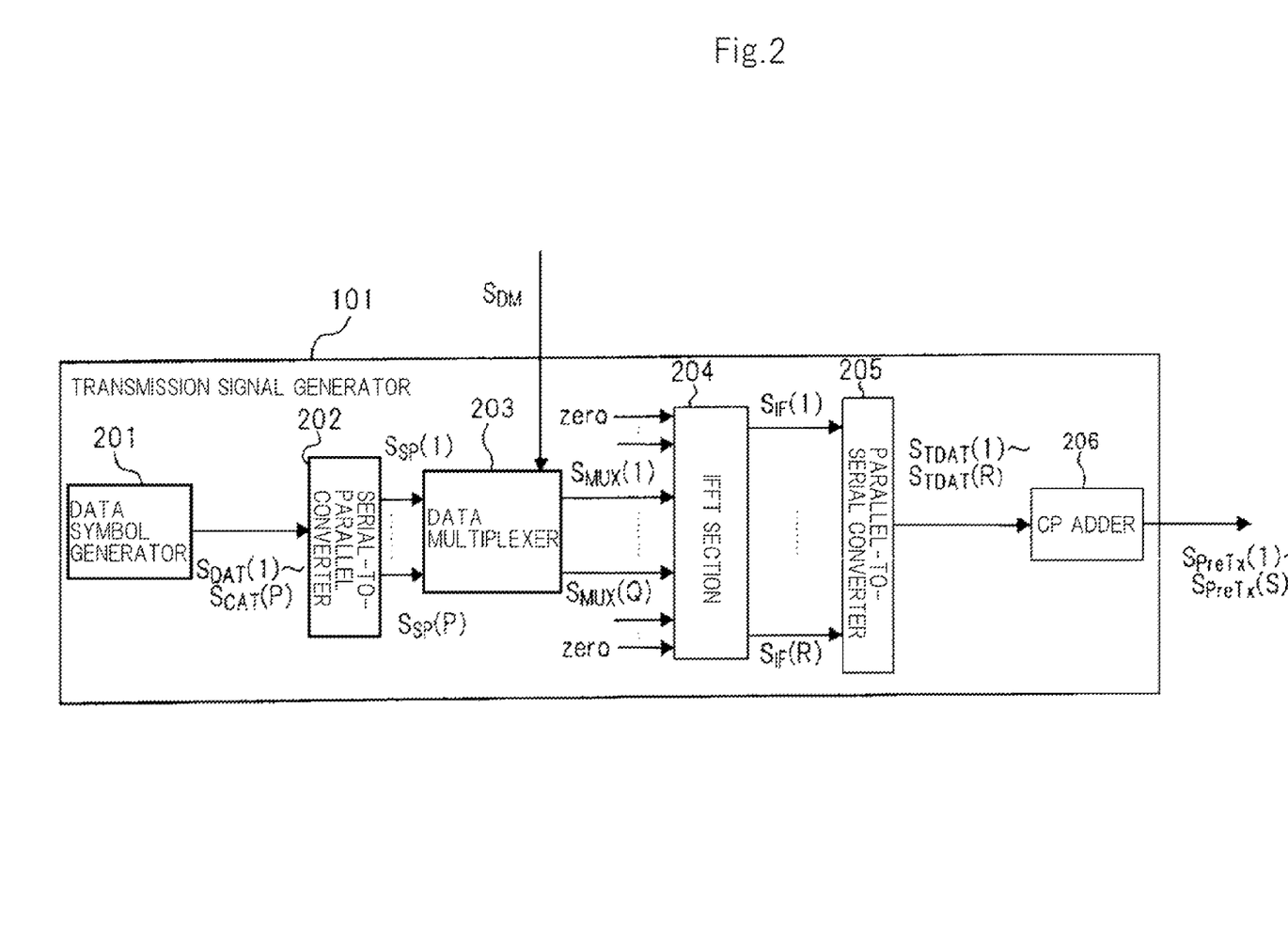
FIG. 2 is a block diagram showing a configuration of a transmission signal generator according to the first exemplary embodiment.

Transmission signal generator 101 is a block for generating OFDM signals prior to peak reduction. FIG. 2 is a block diagram showing a configuration of the transmission signal generator according to the first exemplary embodiment. Transmission signal generator 101 comprises data symbol generator 201, serial-to-parallel converter 202, data multiplexer 203, IFFT section 204, parallel-to-serial converter 205, and CP adder 206.

Data symbol generator 201 outputs P data symbols $S_{DAT}(1), S_{DAT}(2), \ldots, S_{DAT}(P)$ where P represents a natural number.

Serial-to-parallel converter 202 is supplied with data symbols $S_{DAT}(1), S_{DAT}(2), \ldots, S_{DAT}(P)$, and converts them from serial data into parallel data, thereby generating and outputting parallel-converted data symbols $S_{SP}(1), S_{SP}(2), \ldots, S_{SP}(P)$.

Data multiplexer 203 is supplied with data multiplexing subcarrier identification signal $S_{DM}$ from data multiplexing subcarrier identification signal generator 100, multiplexes one of parallel-converted data symbols $S_{SP}(1), S_{SP}(2), \ldots, S_{SP}(P)$ with each of the subcarriers indicated by data multiplexing subcarrier identification signal $S_{DM}$, and sets the components of other (Q-P) subcarriers to 0, thereby generating and outputting subcarrier-multiplexed data symbols $S_{MUX}(1), S_{MUX}(2), \ldots, S_{MUX}(Q)$ comprising a total of Q subcarriers where Q represents a positive integer equal to or greater than P.

IFFT section 204 is supplied with subcarrier-multiplexed data symbols $S_{MUX}(1), S_{MUX}(2), \ldots, S_{MUX}(Q)$, converts subcarrier-multiplexed data symbols $S_{MUX}(1), S_{MUX}(2), \ldots, S_{MUX}(Q)$ and frequency-domain signals where the components of other (R-Q) subcarriers at high frequencies and low frequencies are set to 0, into time-domain signals according to IFFT (Inverse Fast Fourier Transform), thereby generating and outputting IFFT output signals $S_{IF}(1), S_{IF}(2), \ldots, S_{IF}(R)$ where R represents a positive integer equal to or greater than Q.

Parallel-to-serial converter 205 is supplied with IFFT output signals $S_{IF}(1), S_{IF}(2), \ldots, S_{IF}(R)$, and converts them from parallel data into serial data, thereby generating and outputting time-domain data symbols $S_{TDAT}(1), S_{TDAT}(2), \ldots, S_{TDAT}(R)$.

CP adder 206 is supplied with time-domain data symbols $S_{TDAT}(1), S_{TDAT}(2), \ldots, S_{TDAT}(R)$, and adds (S-R) cyclic prefix components to them, thereby generating and outputting prior-to-peak-reduction signals $S_{PreTx}(1), S_{PreTx}(2), \ldots, S_{PreTx}(S)$ where S represents a positive integer equal to or greater than R.

Prior-to-peak-reduction signals $S_{PreTx}(1), S_{PreTx}(2), \ldots, S_{PreTx}(S)$ are input to peak reducing transmission signal generator 102.

Peak reducing transmission signal generator 102 is a block for repeating a peak reducing transmission signal generating process a given number of times on prior-to-peak-reduction signals $S_{PreTx}(1), S_{PreTx}(2), \ldots, S_{PreTx}(S)$ from transmission signal generator 101. Specifically, peak reducing transmission signal generator 102 performs a peak reducing transmission signal generating process based on TR with RT a given number of times (E times), and then performs a peak reducing transmission signal generating process based on TR without RT a given number of times (F times) where E and F are natural numbers.

Figure 3:
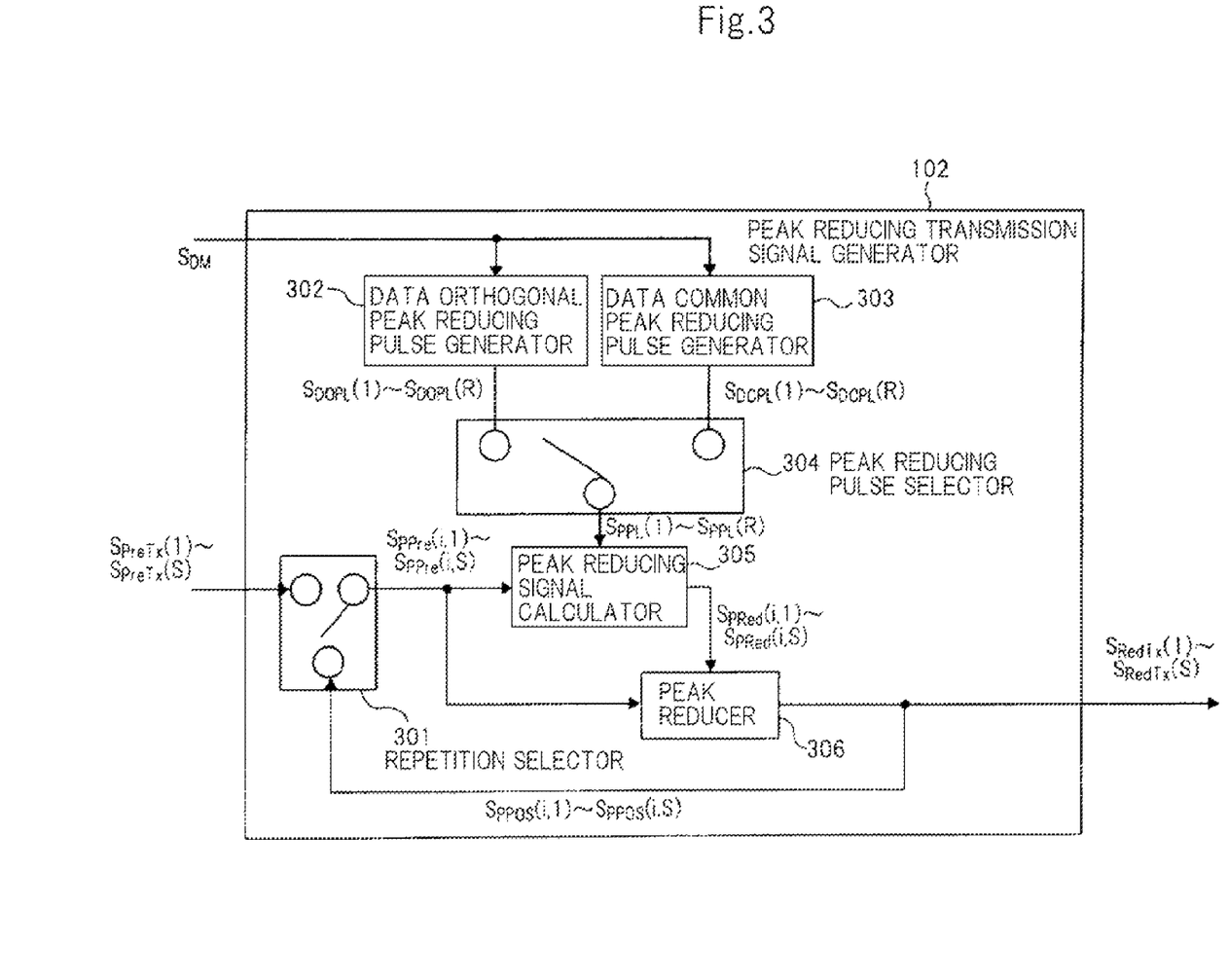
FIG. 3 is a block diagram showing a configuration of a peak reducing signal generator according to the first exemplary embodiment.

FIG. 3 is a block diagram showing a configuration of the peak reducing signal generator according to the first exemplary embodiment. As shown in FIG. 3, peak reducing transmission signal generator 102 comprises repetition selector 301, data orthogonal peak reducing pulse generator 302, data common peak reducing pulse generator 303, peak reducing pulse selector 304, peak reducing signal calculator 305, and peak reducer 306. Data multiplexing subcarrier identification signal $S_{DM}$ from data multiplexing subcarrier identification signal generator 100 is input to data orthogonal peak reducing pulse generator 302 and to data common peak reducing pulse generator 303. Prior-to-peak-reduction signals $S_{PreTx}(1), S_{PreTx}(2), \ldots, S_{PreTx}(S)$ from transmission signal generator 101 are input to repetition selector 301.

Figure 4:
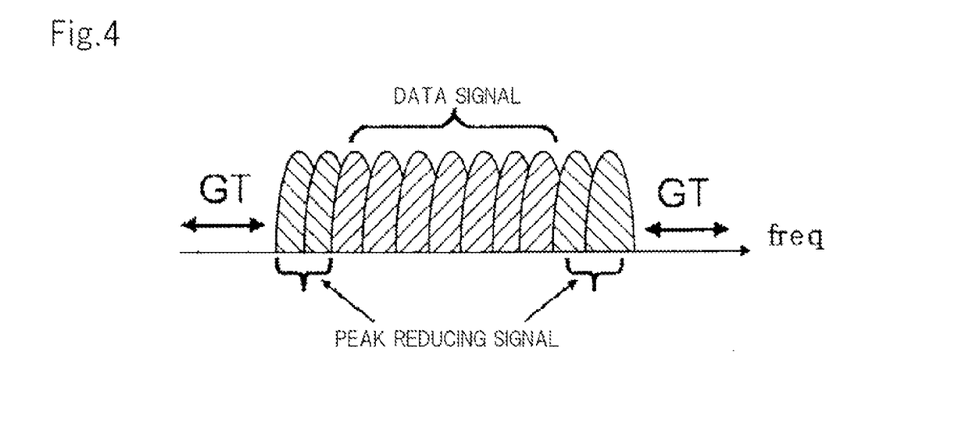
FIG. 4 is a diagram showing the generation of a peak reducing pulse signal with a data orthogonal peak reducing pulse generator according to the first exemplary embodiment.

Data orthogonal peak reducing pulse generator 302 which is supplied with data multiplexing subcarrier identification signal $S_{DM}$ generates data orthogonal peak reducing pulse signals $S_{DOPL}(1), S_{DOPL}(2), \ldots, S_{DOPL}(R)$, and outputs them to peak reducing pulse selector 304. At this time, as shown in FIG. 4, data orthogonal peak reducing pulse generator 302 sets the components of subcarriers which do not correspond to data multiplexing subcarrier identification signal $S_{DM}$ to 1 and sets the components of other subcarriers to 0, thereby setting a total of R subcarriers. FIG. 4 shows by way of example subcarriers for use with data orthogonal peak reducing pulse signals based on TR with RT, wherein GT refers to guard tone (GT). Data orthogonal peak reducing pulse generator 302 performs IFFT with R points on the R subcarriers, thereby generating data orthogonal peak reducing pulse signals $S_{DOPL}(1), S_{DOPL}(2), \ldots, S_{DOPL}(R)$.

Figure 5:
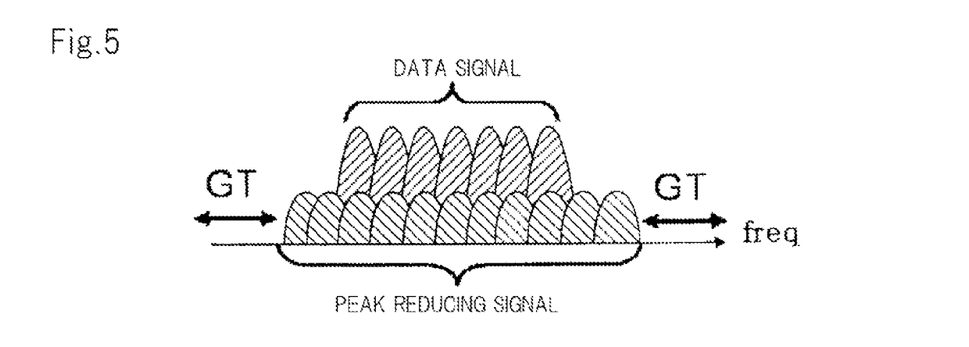
FIG. 5 is a diagram showing the generation of a peak reducing pulse signal with a data common peak reducing pulse generator according to the first exemplary embodiment.

Data common peak reducing pulse generator 303 which is supplied with data multiplexing subcarrier identification signal $S_{DM}$ generates data common peak reducing pulse signals $S_{DCPL}(1), S_{DCPL}(2), \ldots, S_{DCPL}(R)$, and outputs them to peak reducing pulse selector 304. At this time, as shown in FIG. 5, data common peak reducing pulse generator 303 sets the components of a total of Q subcarriers, i.e., subcarriers which do not correspond to data multiplexing subcarrier identification signal $S_{DM}$ and subcarriers which correspond to data multiplexing subcarrier identification signal $S_{DM}$, to 1 and sets the components of a total of (R-Q) subcarriers at high frequencies and low frequencies to 0, thereby setting a total of R subcarriers. FIG. 5 shows by way of example subcarriers for use with data common peak reducing pulse signals based on TR without RT. Data common peak reducing pulse generator 303 performs IFFT with R points on the R subcarriers, thereby generating data common peak reducing pulse signals $S_{DCPL}(1), S_{DCPL}(2), \ldots, S_{DCPL}(R)$.

Repetition selector 301 selects either input signals from transmission signal generator 101 or input signals from peak reducer 306, and outputs the selected input signals as ith prior-to-peak-reduction transmission signals $S_{PPre}(i,1)$, $S_{PPre}(i,2), \ldots, S_{PPre}(i,S)$ to peak reducing signal calculator 305 and peak reducer 306, where i represents an integer equal to or greater than 0.

In a first peak reducing transmission signal generating process, repetition selector 301 outputs prior-to-peak-reduction signals $S_{PreTx}(1), S_{PreTx}(2), \ldots, S_{PreTx}(S)$ input from transmission signal generator 101 as 0th prior-to-peak-reduction transmission signals $S_{PPre}(0,1), S_{PPre}(0,2), \ldots, S_{PPre}(0,S)$.

In subsequent peak reducing transmission signal generating processes, repetition selector 301 outputs (i−1)th subsequent-to-peak-reduction transmission signals $S_{PPos}(i-1,1), S_{PPos}(i-1,2), \ldots, S_{PPos}(i-1,S)$ input from peak reducer 306 as ith prior-to-peak-reduction transmission signals $S_{PPre}(i,1), S_{PPre}(i,2), \ldots, S_{PPre}(i,S)$.

Peak reducing pulse selector 304 selects either input signals from data orthogonal peak reducing pulse generator 302 or input signals from data common peak reducing pulse generator 303, and outputs the selected input signals as peak reducing pulse signals $S_{PPL}(1), S_{PPL}(2), \ldots, S_{PPL}(R)$ to peak reducing signal calculator 305.

At this time, in initial E peak reducing transmission signal generating processes, peak reducing pulse selector 304 selects data orthogonal peak reducing pulse signals $S_{DOPL}(1), S_{DOPL}(2), \ldots, S_{DOPL}(R)$ from data orthogonal peak reducing pulse generator 302. In subsequent F peak reducing transmission signal generating processes, peak reducing pulse selector 304 selects data common peak reducing pulse signals $S_{DCPL}(1), S_{DCPL}(2), \ldots, S_{DCPL}(R)$ from data common peak reducing pulse generator 303.

Peak reducing signal calculator 305 which is supplied with peak reducing pulse signals $S_{PPL}(1), S_{PPL}(2), \ldots, S_{PPL}(R)$ from peak reducing pulse selector 304 and ith prior-to-peak-reduction transmission signals $S_{PPre}(i,1), S_{PPre}(i,2), \ldots, S_{PPre}(i,S)$ from repetition selector 301 generates and outputs ith peak reducing signals $S_{PRed}(i,1), S_{PRed}(i,2), \ldots, S_{PRed}(i,S)$.

At this time, peak reducing signal calculator 305 first detects peak signal points $S_{Peak}(i,1), S_{Peak}(i,1), \ldots, S_{Peak}(i,U(i))$ whose signal power exceeds a given threshold A from ith prior-to-peak-reduction transmission signals $S_{PPre}(i,1), S_{PPre}(i,2), \ldots, S_{PPre}(i,S)$, where A represents a positive real number and U(i) represents a natural number equal to or smaller than S.

Then, peak reducing signal calculator 305 multiplies peak reducing pulse signals $S_{PPL}(1), S_{PPL}(2), \ldots, S_{PPL}(R)$ by the value of the component exceeding the threshold A with respect to each of the detected peak signal points $S_{Peak}(i,V)$ (V represents a natural number equal to or smaller than U(i)). Furthermore, peak reducing signal calculator 305 shifts the product signals in a negative direction by X samples so that the absolute values of the amplitudes of the peak reducing pulse signals will be maximum at a sampling time 0, thereby generating peak component multiplication signals $S_{MUPK}(i,V,1), S_{MUPK}(i,V,2), \ldots, S_{MUPK}(i,V,S)$ where X represents an integer equal to or greater than 0 and smaller than S.

Then, peak reducing signal calculator 305 shifts peak component multiplication signals $S_{MUPK}(i,V,1), S_{MUPK}(i,V,2), \ldots, S_{MUPK}(i,V,S)$ in a positive direction by a sampling time W which corresponds to the sampling time of peak signal points $S_{Peak}(i,V)$ where W represents a natural number, thereby generating individual peak reducing signals $S_{PKCS}(i,V,1), S_{PKCS}(i,V,2), \ldots, S_{PKCS}(i,V,S)$.

Then, peak reducing signal calculator 305 adds all the individual peak reducing signals that have been generated with respect to the U(i) peak signal points in the respective same sampling times, thus generating ith peak reducing signals $S_{PRed}(i,1), S_{PRed}(i,2), \ldots, S_{PRed}(i,S)$.

Peak reducer 306 which is supplied with ith prior-to-peak-reduction transmission signals $S_{PPre}(i,1), S_{PPre}(i,2), \ldots, S_{PPre}(i,S)$ and ith peak reducing signals $S_{PRed}(i,1), S_{PRed}(i,2), \ldots, S_{PRed}(i,S)$ generates and outputs ith subsequent-to-peak-reduction transmission signals $S_{PPos}(i-1,1), S_{PPos}(i-1,2), \ldots, S_{PPos}(i-1,S)$.

Specifically, peak reducer 306 subtracts ith peak reducing signals $S_{PRed}(i,1), S_{PRed}(i,2), \ldots, S_{PRed}(i,S)$ from ith prior-to-peak-reduction transmission signals $S_{PPre}(i,1), S_{PPre}(i,2), \ldots, S_{PPre}(i,S)$ in the respective same sampling times, thus generating ith subsequent-to-peak-reduction transmission signals $S_{PPos}(i-1,1), S_{PPos}(i-1,2), \ldots, S_{PPos}(i-1,S)$. In this manner, peaks of transmission signals are reduced.

Until i=E+F, ith subsequent-to-peak-reduction transmission signals $S_{PPos}(i-1,1), S_{PPos}(i-1,2), \ldots, S_{PPos}(i-1,S)$ from peak reducer 306 are input to repetition selector 301 to repeat peak reducing transmission signal generating processes. When i=E+F, (E+F)th subsequent-to-peak-reduction transmission signals $S_{PPos}(E+F,1), S_{PPos}(E+F,2), \ldots, S_{PPos}(E+F,S)$ are output as low peak power transmission signals $S_{RedTx}(1), S_{RedTx}(2), \ldots, S_{RedTx}(S)$ out of peak reducing transmission signal generator 102.

According to the present exemplary embodiment, as described above, peaks of transmission signals are reduced according to a combination of a peak reducing process based on TR with RT which is free of modulation-accuracy reductions, and a peak reducing process based on TR without RT which does not limit peak reductions depending on the number of RT subcarriers not used for data signals. Therefore, signal power peak reductions can be increased while modulation accuracy reductions are minimized.

Modulation accuracy reductions caused by the peak reducing process based on TR without RT depend on the PAPR reduction. According to the present exemplary embodiment, the peak reducing process based on TR with RT is carried out, and then the peak reducing process based on TR without RT is carried out. Therefore, peaks of transmission signals are reduced by the peak reducing process based on TR with RT prior to the peak reducing process based on TR without RT, thereby reducing modulation accuracy reductions which tend to be caused when a target signal power peak reduction is achieved.

The results of an evaluation of the first exemplary embodiment will be described below.

Figure 6:
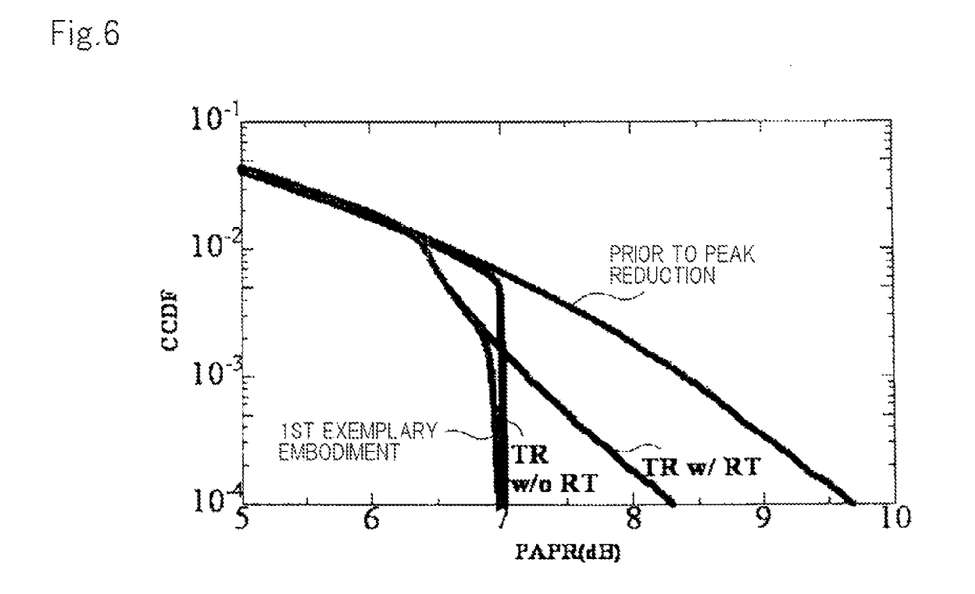
FIG. 6 is a graph showing the results of a simulation with respect to the first exemplary embodiment.

FIG. 6 is a graph showing the results of a simulation with respect to the first exemplary embodiment. FIG. 6 illustrates a complementary cumulative distribution function (CCDF) representing a peak-to-average power ratio.

According to the present simulation, both E and F are set to 1. Specifically, the peak reducing process based on TR with RT using a data orthogonal peak reducing pulse signal is performed once, and then the peak reducing process based on TR without RT using a data common peak reducing pulse signal is performed once.

Figure 7:
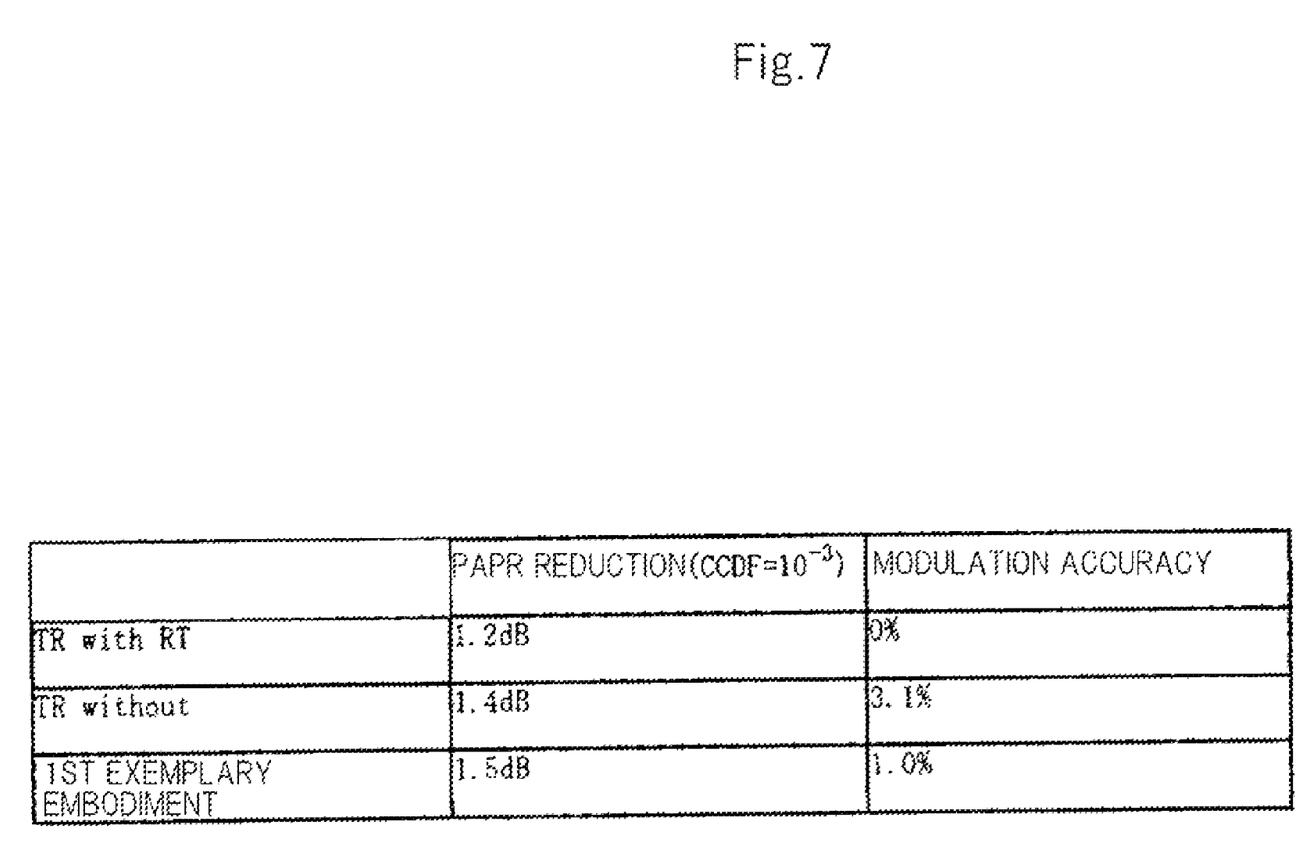
FIG. 7 is a table showing evaluated values of PAPR reduction and modulation accuracy with respect to the first exemplary embodiment.

FIG. 7 is a table showing evaluated values of PAPR reduction and modulation accuracy with respect to the first exemplary embodiment. FIG. 7 illustrates, for comparison with the present exemplary embodiment, evaluated values obtained when only the peak reducing process based on TR with RT is performed and evaluated values obtained when only the peak reducing process based on TR without RT is performed, as well as the evaluated values according to the present exemplary embodiment.

As shown in FIG. 7, according to the peak reducing process based on TR without RT, EVM is 3.1% when a PAPR reduction of 1.4 dB (@CCDF=99.9%) is achieved. A maximum PAPR reduction obtained by the peak reducing process based on TR with RT is 1.2 dB.

According to the present exemplary embodiment, EVM is 1.0% when a PAPR reduction (1.5 dB) comparable to a PAPR reduction (1.4 dB) obtained by the peak reducing process based on TR without RT is achieved. According to the present exemplary embodiment, therefore, the modulation accuracy is improved by 2.1%.

According to the present exemplary embodiment, furthermore, while the spectrum use efficiency remains comparable to that of the peak reducing process based on TR with RT, the peak reduction is 0.3 dB better than the maximum PAPR reduction according to the peak reducing process based on TR with RT.

Second Exemplary Embodiment

According to the first exemplary embodiment, the number of times (E times) that the peak reducing process based on TR with RT is carried out and the number of times (F times) that the peak reducing process based on TR without RT is carried out are predetermined. According to the second exemplary embodiment, the peak reducing process based on TR with RT is switched to the peak reducing process based on TR without RT and the peak reducing process based on TR without RT is finished based on comparison of signal powers with a threshold value.

Figure 8:
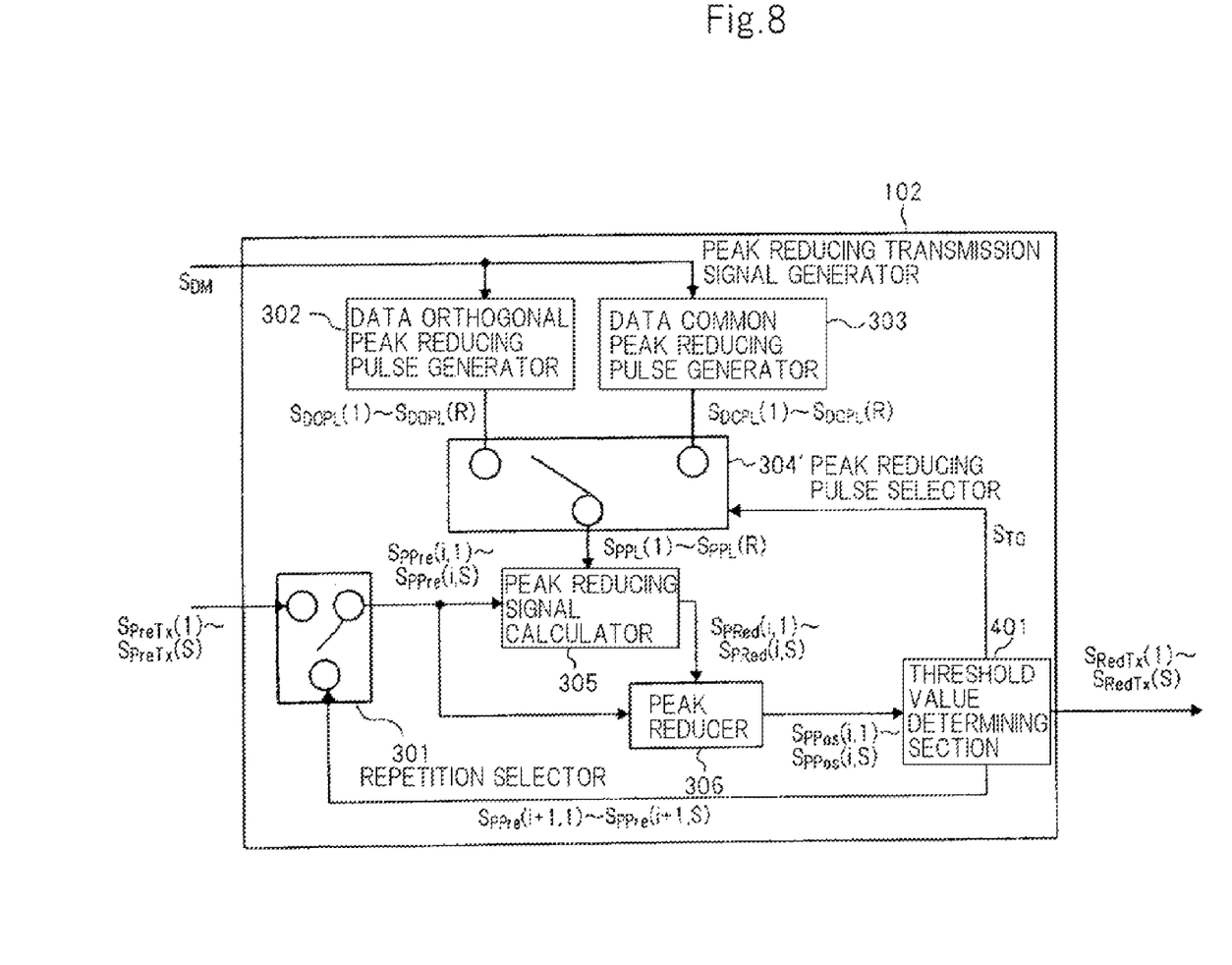
FIG. 8 is a block diagram showing a configuration of a peak reducing signal generator according to a second exemplary embodiment.

FIG. 8 is a block diagram showing a configuration of a peak reducing signal generator according to the second exemplary embodiment. Peak reducing transmission signal generator 102' comprises repetition selector 301, data orthogonal peak reducing pulse generator 302, data common peak reducing pulse generator 303, peak reducing pulse selector 304, peak reducing signal calculator 305, peak reducer 306, and threshold value determining section 401.

Threshold value determining section 401 measures signal powers of ith subsequent-to-peak-reduction transmission signals $S_{PPos}(i,1), S_{PPos}(i,2), \ldots, S_{PPos}(i,S)$ each time the peak reducing process based on TR with RT is performed, and compares the measured signal powers with threshold value G. If the signal powers of all the signal points are smaller than threshold value G, then threshold value determining section 401 outputs peak reducing pulse switching signal $S_{TG}$ to peak reducing pulse selector 304' to cause switching of peak reducing pulses, where G represents a positive real number.

When supplied with peak reducing pulse switching signal $S_{TG}$ from threshold value determining section 401, peak reducing pulse selector 304' according to the present exemplary embodiment switches peak reducing pulse signals $S_{PPL}(1), S_{PPL}(2), \ldots, S_{PPL}(S)$ to be sent to peak reducing signal calculator 305, from data orthogonal peak reducing pulse signals $S_{DOPL}(1), S_{DOPL}(2), \ldots, S_{DOPL}(R)$ to data common peak reducing pulse signals $S_{DCPL}(1), S_{DCPL}(2), \ldots, S_{DCPL}(R)$. In the subsequent peak reducing process, therefore, data common peak reducing pulse signals $S_{DCPL}(1), S_{DCPL}(2), \ldots, S_{DCPL}(R)$ are used.

Each time the peak reducing process based on TR with RT or TR without Rt is carried out, threshold value determining section 401 compares the signal powers of ith subsequent-to-peak-reduction transmission signals $S_{PPos}(i,1), S_{PPos}(i,2), \ldots, S_{PPos}(i,S)$ with threshold value H. If there is a signal power whose signal power is equal to or greater than threshold value H, then threshold value determining section 401 outputs ith subsequent-to-peak-reduction transmission signals $S_{PPos}(i,1), S_{PPos}(i,2), \ldots, S_{PPos}(1,S)$ as (i+1)th prior-to-peak-reduction transmission signals $S_{PPre}(i+1,1), S_{PPre}(i+1,2), \ldots,$ $S_{PPre}(i+1,S)$ to repetition selector 301, thereby repeating the peak reducing process. If the signal powers of all the signal points are smaller than threshold value H, then threshold value determining section 401 outputs ith sub-sequent-to-peak-reduction transmission signals $S_{PPos}(i,1)$, $S_{PPos}(i,2)$ . . . , $S_{PPos}(i,S)$ as low peak power transmission signals $S_{RedTx}(1)$, $S_{RedTx}(2)$, . . . , $S_{OPos}(S)$ out of peak reducing transmission signal generator 102', where H represents a positive real number smaller than G.

According to the present exemplary embodiment, as described above, since the peak reducing process based on TR without RT is finished based on comparison of signal powers with a threshold value, the peak reducing process is finished when a target peak reduction is reached, and hence a target signal power peak reduced can be reached with a higher modulation accuracy.

According to the present exemplary embodiment, moreover, the peak reducing process based on TR with RT is switched to the peak reducing process based on TR without RT based on comparison of signal powers with a threshold value. Consequently, the peak reducing process based on TR without RT can be carried out after peaks are reduced to a certain level by the peak reducing process based on TR with RT which is free of modulation accuracy reductions. As a result, modulation accuracy reductions which increase depending on the PAPR reductions in the peak reducing process based on TR without RT are minimized.

In the present exemplary embodiment, in order to prevent a processing delay of the overall peak reducing transmission signal generating process from increasing beyond a certain level as the number of times that the peak reducing process is repeated increases, threshold value determining section 401 may have upper limits predetermined for the number of times that the peak reducing processes based on TR with RT and TR without Rt are repeated.

In such a case, when the number of times that the peak reducing process based on TR with RT is repeated reaches its upper limit, threshold value determining section 401 may output peak reducing pulse switching signal $S_{TG}$ to peak reducing pulse selector 304' even through the signal powers have not been reduced below threshold value G.

In addition, when the number of times that the peak reducing process based on TR without RT is repeated reaches its upper limit, threshold value determining section 401 may output ith subsequent-to-peak-reduction transmission signals $S_{PPos}(i,1)$, $S_{PPos}(i,2)$, . . . , $S_{PPos}(i,S)$ as low peak power transmission signals $S_{RedTx}(1)$, $S_{RedTx}(2)$, . . . , $S_{OPos}(S)$ out of peak reducing transmission signal generator 102'.

Third Exemplary Embodiment

According to the first exemplary embodiment, data common peak reducing pulse generator 303 generates data common peak reducing pulse signals $S_{DCPL}(1)$, $S_{DCPL}(2)$, . . . , $S_{DCPL}(R)$ using the components of all subcarriers with which data symbols not corresponding to data multiplexing subcarrier identification signal $S_{DM}$ are not multiplexed and the components of all subcarriers with which the data symbols are multiplexed. According to the third exemplary embodiment, data common peak reducing pulse generator 303 selects subcarriers used for data common peak reducing pulse signals from the subcarriers with which the data symbols are multiplexed, based on a required modulation accuracy or a modulation multilevel number.

For maximizing the transmission rate, there is a technology which determines the modulation multilevel number for each subcarrier with the reception SNR (signal to noise power ratio) of the subcarrier in a wireless terminal. According to the technology, a different modulation accuracy is determined based on the modulation multilevel number in specifications or the like, and a higher modulation accuracy is required as the modulation multilevel number is greater.

When data symbols with different modulation multilevel numbers are multiplexed in an entire signal band, if the modulation accuracy after peaks of all subcarriers have been reduced is limited to match the modulation accuracy required by data symbols with the greatest modulation multilevel number, then a sufficient peak reduction may not be achieved because the modulation accuracy may unnecessarily be limited.

Figure 9:
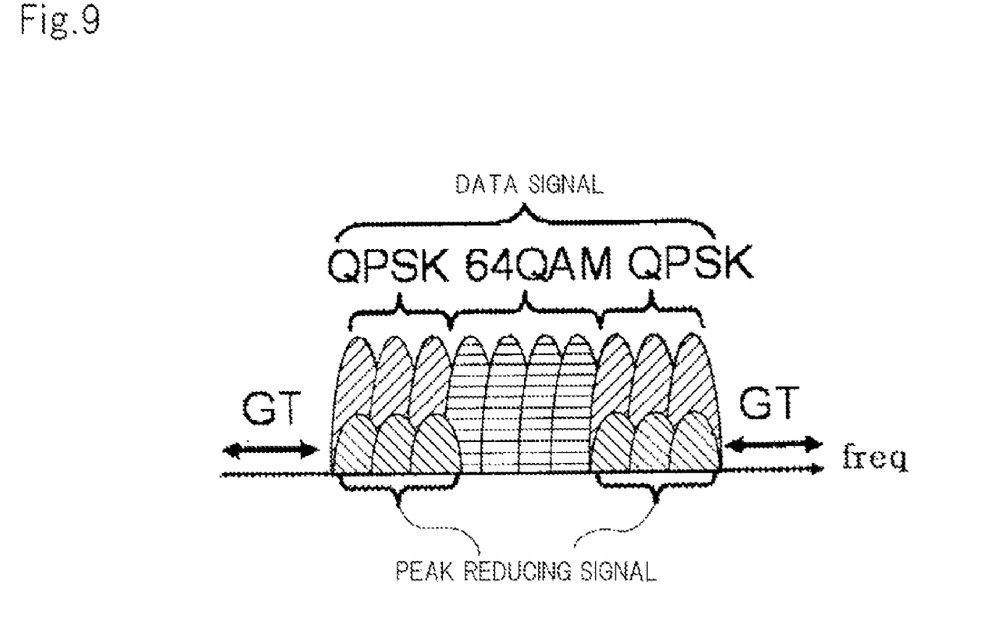
FIG. 9 is a diagram showing the generation of peak reducing pulse signals with a data common peak reducing pulse generator according to a third exemplary embodiment.

According to the present exemplary embodiment, subcarriers for which a modulation accuracy equal to or higher than a certain level is required are not used for data common peak reducing pulse signals. Specifically, data common peak reducing pulse generator 303 according to the present exemplary embodiment sets the components of subcarriers, among all the subcarriers with which data symbols are multiplexed, for which a modulation accuracy equal to or higher than a certain level is required to 0 and also sets the components of remaining subcarriers to 1, thereby generating data common peak reducing pulse signals. In this manner, high peak reductions can be achieved while reductions in the modulation accuracy for data symbols with large modulation level numbers are lowered.

FIG. 9 is a diagram showing the generation of peak reducing pulse signals with a data common peak reducing pulse generator according to the third exemplary embodiment. In the example shown in FIG. 9, modulation processes QPSK and 64 QAM having different modulation level numbers for data symbols are used. The modulation process 64 QAM with a larger modulation level number is required to have a higher modulation accuracy than the modulation process QPSK with a smaller modulation level number.

According to this example, only subcarriers with which data symbols of QPSK with a smaller modulation level number are used for peak reducing signals, and subcarriers with which data symbols of 64 QAM with a larger modulation level number are multiplexed are not used for peak reducing signals. Consequently, peak powers can be reduced without lowering the modulation accuracy of the data symbols of 64 QAM.

Fourth Exemplary Embodiment

Figure 10:
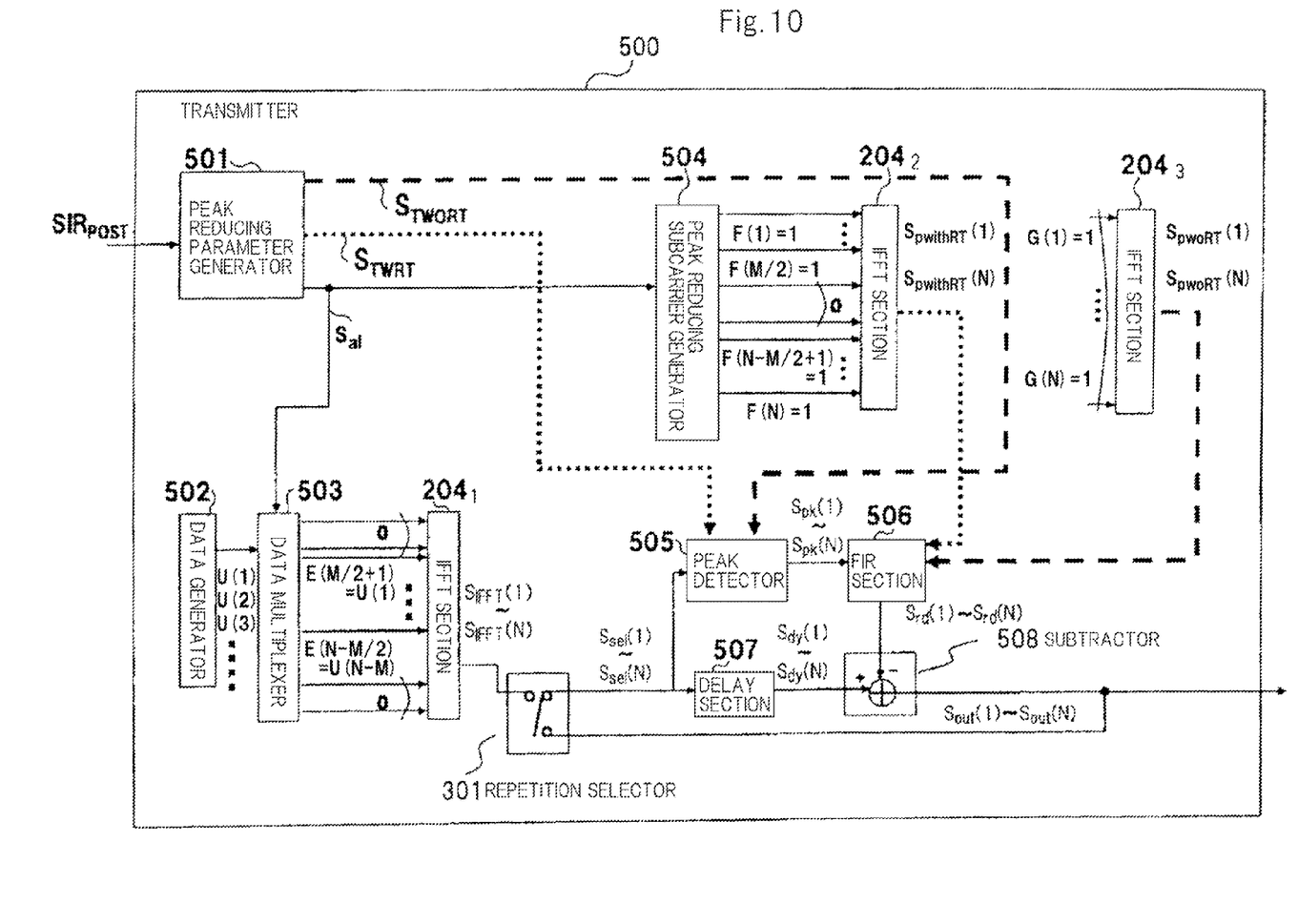
FIG. 10 is a block diagram showing a configuration of a transmitter according to a fourth exemplary embodiment.

According to a fourth exemplary embodiment, the functions about the peak reduction process according to the first exemplary embodiment described above are set out in greater detail. FIG. 10 is a block diagram showing a configuration of a transmitter according to the fourth exemplary embodiment.

The transmitter according to the fourth exemplary embodiment corresponds to the transmission signal generating apparatus according to the first exemplary embodiment. The transmitter and a receiver (not shown) for receiving wireless signals transmitted from the transmitter jointly make up a wireless transmission system. It is assumed that the receiver measures an SIR (signal to interference power ratio) value of signals received from the transmitter, and feeds the measured SIR value back to the transmitter.

According to the present exemplary embodiment, a stage for carrying out the peak reducing process based on TR with RT is referred to as a first stage, and a stage for carrying out the peak reducing process based on TR without RT is referred to as a second stage.

As shown in FIG. 10, transmitter 500 comprises peak reducing parameter generator 501, data generator 502, data multiplexer 503, peak reducing subcarrier generator 504, peak detector 505, FIR (Finite Impulse Response) section 506, delay section 507, subtractor 508, IFFT sections $204_1$ through $204_3$, and repetition selector 301.

Peak reducing parameter generator 501 calculates SIR ($SIR_{Pre}$) in the receiver at the time a PAPR reducing process is not applied, by giving SIR information ($SIR_{Post}$) fed back from the receiver and improved amount (V) of transmission power at the time a preceding PAPR reducing process is performed, to an equation (1) below. The time when the preceding PAPR reducing process is performed refers to the time when the PAPR reducing process is performed in a preceding cycle, which is one feedback RTT (Round Trip Time) earlier.

Thereafter, peak reducing parameter generator 501 generates, based on $SIR_{Pre}$, peak reducing signal multiplex information ($S_{AL}$) indicative of the ratio of subcarriers used for peak reducing signals, peak detecting threshold value ($S_{TWRT}$) in TR with RT, and peak detecting threshold value ($S_{TWORT}$) in TR without RT, and outputs them, where $S_{TWRT}$ and $S_{TWORT}$ represent real numbers.

Peak reducing parameter generator 501 holds an association table which is representative of $S_{AL}$, $S_{TWRT}$, $S_{TWORT}$ for maximizing the throughput for each $SIR_{Pre}$, and uses the association table for generating $S_{AL}$, $S_{TWRT}$, $S_{TWORT}$ based on $SIR_{Pre}$.

Improved amount (V) of transmission power is determined by giving, to an equation (2) below, PAPR at the time the PAPR reducing process is not applied (R in the equation (2)), $S_{TWORT}$ at the time the preceding PAPR reducing process is applied (one RTT earlier), the power of peak reducing signals (b in the equation (2), and a BLER reduction due to the PAPR reducing process (c in the equation (2).

$$SIR_{Pre} = SIR_{Post} - V \quad (1)$$

$$V = R - S_{TWORT} - b - c \quad (2)$$

Data generator 502 generates data symbols (U(1), U(2), U(3) . . . ). Data multiplexer 503 multiplexes 0 with M subcarriers used for peak reducing signal and also multiplexes data symbols (U(1), . . . , U(N-M)) with other (N-M) subcarriers based on peak reducing signal multiplex information $S_{AL}$, thereby generating signals E(1), . . . , E(N), where M represents a natural number and N an integer greater than M, indicating a total subcarrier number. Peak reducing signal multiplex information $S_{AL}$ represents M/N.

IFFT section 204 performs IFFT on signals E(1), . . . , E(N), thereby generating data signals $S_{IFFT}(1)$, . . . , $S_{IFFT}(N)$.

In the first stage, PARR is reduced based on TR with RT. Peak reducing subcarrier generator 504 sets M subcarrier components for peak reducing signals to I(I=1+j0) and remaining subcarrier components to 0 base don peak reducing signal multiplex information $S_{AL}$, thereby generating and outputting signals F(1), . . . , F(N).

IFFT section $204_1$ performs N-point IFFT on signals F(1), . . . , F(N), thereby generating and outputting With RT peak reducing pulses $S_{pwithRT}(1)$ through $S_{pwithRT}(N)$.

Repetition selection 301 outputs data signals $S_{IFFT}(1)$, . . . , $S_{IFFT}(N)$ as signals $S_{sel}(1)$, . . . , $S_{sel}(N)$.

Peak detector 505 outputs signal sequence $S_{pk}(1)$, . . . , $S_{pi}(N)$ which comprises components whose signal power exceeds $S_{TWRT}$ in $S_{sel}(1)$, . . . , $S_{sel}(N)$.

FIR section 506 filters signal sequence $S_{pk}(1)$, . . . , $S_{pi}(N)$ with filter coefficients represented by With RT peak reducing pulses $S_{pwithRT}(1)$ through $S_{pwithRT}(N)$, thereby generating and outputting signal sequence $S_{rd}(1)$, . . . , $S_{rd}(N)$.

Delay section 507 delays signals $S_{sel}(1)$, . . . , $S_{sel}(N)$ by samples corresponding to processing delays in peak detector 505 and FIR section 506, and outputs the delayed signals as $S_{dy}(1)$, . . . , $S_{dy}(N)$.

Subtractor 308 subtracts signal sequence $S_{rd}(1)$, . . . , $S_{rd}(N)$ from $S_{dy}(1)$, . . . , $S_{dy}(N)$, outputting signal sequence $S_{out}(1)$, . . . , $S_{out}(N)$ with reduced peaks.

In the second stage, PARR is further reduced based on TR without RT.

IFFT section 204 performs N-point IFFT on signals G(1), . . . , G(N) where all N subcarriers are set to 1, thereby generating and outputting Without RT peak reducing pulses $S_{pwoRT}(1)$ through $S_{pwoRT}(N)$.

Repetition selector 301 outputs signal sequence $S_{out}(1)$, . . . , $S_{out}(N)$ as $S_{sel}(1)$, . . . , $S_{sel}(N)$.

Peak detector 505 outputs signal sequence $S_{pk}(1)$, . . . , $S_{pi}(N)$ which comprises components whose signal power exceeds $S_{TWORT}$ in $S_{sel}(1)$, . . . , $S_{sel}(N)$.

FIR section 506 filters signal sequence $S_{pk}(1)$, . . . , $S_{pi}(N)$ with filter coefficients represented by Without RT peak reducing pulses $S_{pwoRT}(1)$ through $S_{pwoRT}(N)$, thereby generating and outputting signal sequence $S_{rd}(1)$, . . . , $S_{rd}(N)$.

Delay section 507 delays signals $S_{sel}(1)$, . . . , $S_{sel}(N)$ by samples corresponding to processing delays in peak detector 505 and FIR section 506, and outputs the delayed signals as $S_{dy}(1)$, . . . , $S_{dy}(N)$.

Subtractor 308 subtracts signal sequence $S_{rd}(1)$, . . . , $S_{rd}(N)$ from $S_{dy}(1)$, . . . , $S_{dy}(N)$, outputting signal sequence $S_{out}(1)$, . . . , $S_{out}(N)$ with reduced peaks.

According to the present exemplary embodiment, as described above, the peak reducing process based on TR with RT which is modulation accuracy reductions and the peak reducing process based on TR without RT which does not limit peak reductions depending on the number of RT subcarriers not used for data signals are combined with each other to reduce peaks of transmission signals. Consequently, signal power peak reductions can be increased while modulation accuracy reductions are minimized.

Modulation accuracy reductions caused by the peak reducing process based on TR without RT depend on the PAPR reduction. According to the present exemplary embodiment, the peak reducing process based on TR with RT is carried out, and then the peak reducing process based on TR without RT is carried out. Therefore, peaks of transmission signals are reduced by the peak reducing process based on TR with RT prior to the peak reducing process based on TR without RT, thereby reducing modulation accuracy reductions which tend to be caused when a target signal power peak reduction is achieved.

The results of an evaluation of the fourth exemplary embodiment will be described below.

Improved amount (V) of transmission power is defined as a PAPR reduction gain. An allowable amount for an EVM reduction due to the PAPR reduction is set to 3% at maximum. Since a BLER (block error rate) measured in the receiver due to an EVM reduction is smaller than 0.1 dB, c in the equation (2) is assumed to be 0.

The subcarrier number (N) is set to 300, and QPSK, 16 QAM modulation, and a turbo-code (R=1/3, 1/2, 2/3, 3/4, 4/5) are used for the evaluation. A propagation path for evaluating the BLER is Typical Urban 6 path, with the Doppler frequency being of 5.55 Hz.

An equation (3) below is representative of the relationship between the throughput ($Th_{Post}$) after PAPR is reduced and peak reducing signal multiplex information ($S_{AL}$). Peak reducing signal multiplex information $S_{AL}$ is 0.05, 0.1, and 0.2.

$$Th_{Post}(SIR_{Post})=Th_{Pre}(SIR_{Post})(1-S_{AL}) \quad (3)$$

Figure 11:
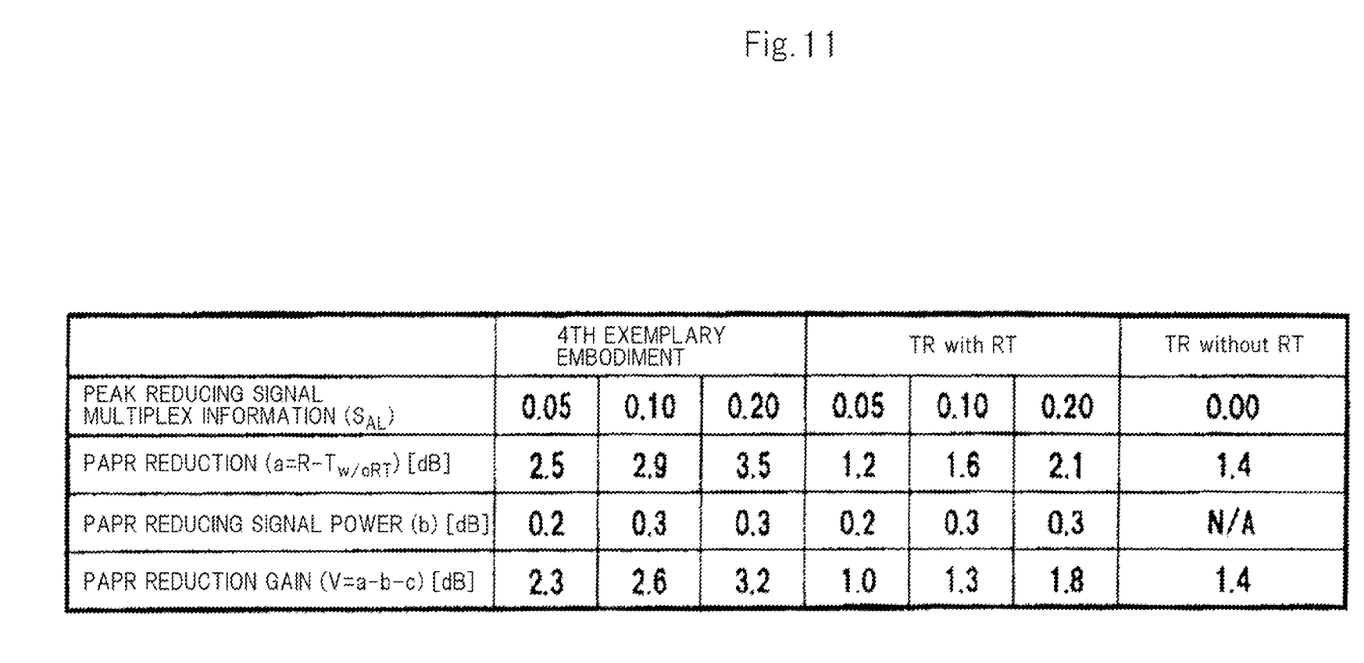
FIG. 11 is a table showing evaluated values of PAPR reduction gain with respect to the fourth exemplary embodiment.

FIG. 11 is a table showing evaluated values of PAPR reduction gain with respect to the fourth exemplary embodiment. The table shows that according to the fourth exemplary embodiment, the PAPR reduction gain is improved by about 1.3 dB based on TR with RT and about 0.8 dB through 1.8 dB based on TR without RT.

Figure 12:
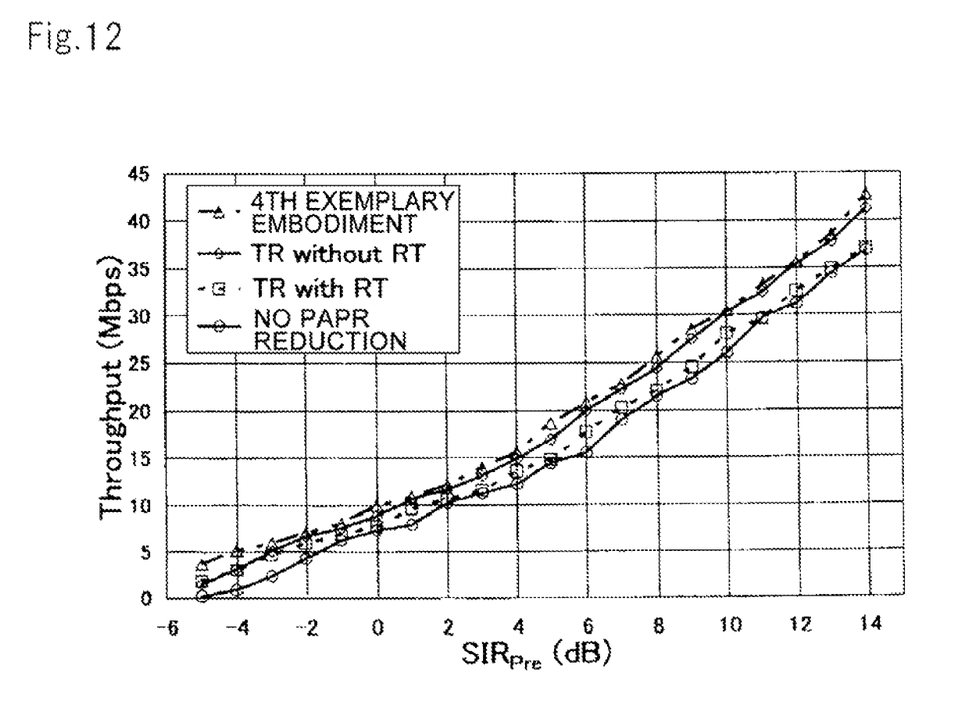
FIG. 12 is a graph showing throughputs vs. $SIR_{Pre}$.

FIG. 12 is a graph showing throughputs vs. $SIR_{Pre}$.

According to the fourth exemplary embodiment, higher throughputs are realized than when the peak reducing process based on TR with RT and the peak reducing process based on TR without RT according to the background art are carried, not based on $SIR_{Pre}$. Particularly, in a low SIR range which is short of transmission power, the throughputs are highly improved according to the fourth exemplary embodiment. When $SIR_{Pre}$ is −5 dB ($S_{AL}$=0.2, $S_{TWORT}$=6.4 dB, $S_{TWORT}$=5.0 dB), a throughput which is about 2.4 times the throughput based on TR without RT and a throughput which is about 2.0 times the throughput based on TR with RT are achieved according to the fourth exemplary embodiment.

The present invention has been described above in reference to the exemplary embodiments thereof. However, the present invention is not limited to the exemplary embodiments. Various changes that can be understood by those skilled in the art can be made in the configurations and details of the present invention, which are defined in the claims, within the scope of the present invention.

The invention claimed is:

1. A transmission signal generating apparatus for generating transmission signals with reduced peak power, the apparatus comprising:
a data multiplexing subcarrier identification signal generator that generates a data multiplexing subcarrier identification signal that identifies subcarriers with which data signals are to be multiplexed;
a transmission signal generator that generates transmission signals by multiplexing data signals with subcarriers according to the data multiplexing subcarrier identification signal generated by said data multiplexing subcarrier identification signal generator; and
a peak reducing transmission signal generator that generates peak reducing transmission signals by reducing peak power of said transmission signals generated by said transmission signal generator according to peak reducing signals in a combination of a first peak reducing process in which subcarriers, with which the data signals are not multiplexed, are used for the peak reducing signals and subcarriers, with which the data signals are multiplexed, are not used for the peak reducing signals based on said data multiplexing subcarrier identification signal, and a second peak reducing process in which both subcarriers, with which the data signals are not multiplexed and the subcarriers with which the data signals are multiplexed, are used for the peak reducing signals;
wherein said peak reducing transmission signal generator:
carries out said second peak reducing process after having carried out said first peak reducing process;
recursively repeats said first peak reducing process to generate the peak reducing signals based on said transmission signals and adds the peak reducing signals to said transmission signals by a predetermined number of times; and
thereafter, recursively repeats said second peak reducing process to generate the peak reducing signals based on said transmission signals and adds the peak reducing signals to said transmission signals by a predetermined number of times.

2. The transmission signal generating apparatus according to claim 1, wherein said peak reducing transmission signal generator:
recursively repeats said first peak reducing process to generate the peak reducing signals based on said transmission signals and adds the peak reducing signals to said transmission signals until the peak power of said transmission signals becomes smaller than a first threshold value; and
thereafter, recursively repeats said second peak reducing process to generate the peak reducing signals based on said transmission signals and adds the peak reducing signals to said transmission signals until the peak power of said transmission signals becomes smaller than a second threshold value which is smaller than said first threshold value.

3. The transmission signal generating apparatus according to claim 2, wherein said peak reducing transmission signal generator:
predetermines upper limits respectively for the number of times that said first peak reducing process is repeated and the number of times that said second peak reducing process is repeated;
shifts into said second peak reducing process even if the peak power of said transmission signals is not smaller than said first threshold value when the number of times that said first peak reducing process is repeated reaches the upper limit therefor; and
outputs said transmission signals as said peak reducing transmission signals even if the peak power of said transmission signals is not smaller than said second threshold value when the number of times that said first peak reducing process is repeated reaches the upper limit therefor.

4. The transmission signal generating apparatus according to claim 1, wherein said peak reducing transmission signal generator does not use subcarriers for which a modulation accuracy for the data signals is required to be higher than a predetermined level in said second peak reducing process, among the subcarriers with which the data signals are multiplexed, for said peak reducing signals.

5. The transmission signal generating apparatus according to claim 4, wherein said peak reducing transmission signal generator does not use subcarriers for which a modulation multilevel number for the data signals is equal to or higher than a predetermined level in said second peak reducing process, among the subcarriers with which the data signals are multiplexed, for said peak reducing signals.

6. A transmission signal generating method of generating transmission signals with reduced peak power, the method comprising:
generating a data multiplexing subcarrier identification signal that identifies subcarriers with which data signals are to be multiplexed;
generating transmission signals by multiplexing data signals with subcarriers according to the data multiplexing subcarrier identification signal; and
generating peak reducing transmission signals by reducing peak power of said transmission signals according to peak reducing signals in a combination of a first peak reducing process in which subcarriers, with which the data signals are not multiplexed, are used for the peak reducing signals and subcarriers, with which the data signals are multiplexed, are not used for the peak reducing signals based on said data multiplexing subcarrier identification signal, and a second peak reducing process in which both subcarriers, with which the data signals are not multiplexed, and the subcarriers, with which the data signals are multiplexed are used for the peak reducing signals, wherein said generating peak reducing transmission signals comprises:

carrying out said second peak reducing process after having carried out said first peak reducing process;

recursively repeating said first peak reducing process to generate the peak reducing signals based on said transmission signals and adding the peak reducing signals to said transmission signals by a predetermined number of times; and thereafter, recursively repeating said second peak reducing process to generate the peak reducing signals based on said transmission signals and adding the peak reducing signals to said transmission signals by a predetermined number of times.

7. A non-transitory computer-readable medium containing a computer program for controlling a transmission signal generating apparatus to generate transmission signals with reduced peak power, said computer program comprising:

a sequence to generate a data multiplexing subcarrier identification signal that identifies subcarriers with which data signals are to be multiplexed;

a sequence to generate transmission signals by multiplexing data signals with subcarriers according to the data multiplexing subcarrier identification signal; and a sequence to generate peak reducing transmission signals by reducing peak power of said transmission signals according to peak reducing signals in a combination of a first peak reducing process in which subcarriers, with which the data signals are not multiplexed, are used for the peak reducing signals and subcarriers, with which the data signals are multiplexed, are not used for the peak reducing signals based on said data multiplexing subcarrier identification signal, and a second peak reducing process in which both subcarriers, with which the data signals are not multiplexed, and the subcarriers, with which the data signals are multiplexed, are used for the peak reducing signals, wherein said sequence to generate peak reducing transmission signals carries out said second peak reducing process after having carried out said first peak reducing process;

recursively repeats said first peak reducing process to generate the peak reducing signals based on said transmission signals and adds the peak reducing signals to said transmission signals by a predetermined number of times; and thereafter, recursively repeats said second peak reducing process to generate the peak reducing signals based on said transmission signals and adds the peak reducing signals to said transmission signals by a predetermined number of times.

* * * * *